United States Patent
Oishi

(10) Patent No.: US 7,705,417 B2
(45) Date of Patent: Apr. 27, 2010

(54) SEMICONDUCTOR DEVICE AND METHOD OF FABRICATING ISOLATION REGION

(75) Inventor: Amane Oishi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 11/882,083

(22) Filed: Jul. 30, 2007

(65) Prior Publication Data
US 2008/0217702 A1 Sep. 11, 2008

(30) Foreign Application Priority Data
Aug. 4, 2006 (JP) .............................. 2006-213631

(51) Int. Cl.
*H01L 27/088* (2006.01)
(52) U.S. Cl. .................. 257/510; 257/E29.02; 257/506
(58) Field of Classification Search ................ 257/506, 257/510, 640, 641, 647, 650, E29.018, E29.02, 257/E29.021, E21.546
See application file for complete search history.

(56) References Cited

U.S. PATENT DOCUMENTS

| 6,187,651 B1 | 2/2001 | Oh | |
| 7,208,812 B2* | 4/2007 | Ohta | 257/510 |
| 2005/0023634 A1* | 2/2005 | Yoon et al. | 257/506 |
| 2005/0221578 A1* | 10/2005 | Kamo et al. | 438/424 |
| 2005/0287731 A1* | 12/2005 | Bian et al. | 438/201 |
| 2007/0132056 A1* | 6/2007 | Williams | 257/510 |

OTHER PUBLICATIONS

Jin-Hwa Heo et al., "Void Free and Low Stress Shallow Trench Isolation Technology Using P-SOG for sub 0.1 μm Device," 2002 Symposium on VLSI Technology Digest of Technical Papers, 2002, pp. 132-133.
K. Ota et al., "Stress Controlled Shallow Trench Isolation Technology to Suppress the Novel Anti-Isotropic Impurity Diffusion for 45nm-node High-Performance CMOSFETs," 2005 Symposium on VLSI Technology Digest of Technical Papers, 2005, p. 138-139.

* cited by examiner

*Primary Examiner*—Victor A Mandala
*Assistant Examiner*—Scott Stowe
(74) *Attorney, Agent, or Firm*—Foley & Lardner LLP

(57) ABSTRACT

A semiconductor device according to an embodiment of the present invention includes: a semiconductor substrate; an isolation region including a liner film formed so as to contact a lower surface and a lower side surface of an inner wall of a trench formed in the semiconductor substrate, a first insulating film formed so that at least a part of a side surface and a lower surface of the first insulating film contact the liner film within the trench, and a second insulating film formed so as to contact an upper side of the first insulating film and formed so as to contact an upper side surface of the inner wall of the trench, the second insulating film having a higher etching resistance than that of the first insulating film; and a plurality of semiconductor elements disposed on the semiconductor substrate so as to be isolated from one another by the isolation region.

18 Claims, 22 Drawing Sheets

SEMICONDUCTOR DEVICE AND METHOD OF FABRICATING ISOLATION REGION

CROSS-REFERENCE TO RELATED APPLICATIONS

This application is based upon and claims the benefit of priority from prior Japanese Patent Application No. 2006-213631, filed on Aug. 4, 2006, the entire contents of which are incorporated herein by reference.

BACKGROUND OF THE INVENTION

The present invention relates to a semiconductor device, and more particularly to a semiconductor device having a feature in its isolation structure, and a method of fabricating an isolation region of the semiconductor device.

An isolation structure useful in realizing scale down of semiconductor element structures has been required along with a high degree of integration of semiconductor devices. In recent years, a shallow trench isolation (STI) structure suitable for a finer isolation structure has been used instead of the conventional Local Oxidation of Silicon (LOCOS) structure. Proposals for various problems of the STI structure have been made for a generation in and after the 45 nm generation.

For example, a semiconductor device having an STI stricture in which a SiN film is formed as a liner film on an inner wall of a trench portion, and a polysilazane-spin on glass (P-SOG) film and an element insulating film are disposed in an upper side and a lower side of the trench portion, respectively, thereby obtaining a two-layer structure is known as conventional one. This semiconductor device, for example, is described in a non-patent literary document 1 of Jin-Hwa Heo, "Void Free and Stress Shallow Trench Isolation Technology using P-SOG for sub 0.1 μm Device", 2002 Symposium on VLSI Technology Digest of Technical Papers. In this semiconductor device, the P-SOG film is disposed as an upper layer of the trench portion, which results in that it is possible to realize an improvement in productivity, relaxation of a stress, and reduction of voides.

In addition, a semiconductor device having an STI structure in which $SiO_2$ films are formed in an upper side and a lower side of a trench portion by utilizing a plasma CVD method and a spin coating method, respectively, thereby obtaining a hybrid structure, for example, is known as another conventional one. This semiconductor device, for example, is described in a non-patent literary document 2 of K. Ota, "Stress Controlled Shallow Trench Technology to Suppress the Novel Anti-Isotropic Impurity Diffusion for 45 nm-node High-Performance CMOSFETs", 2005 Symposium on VLSI Technology Digest of Technical Papers. In this semiconductor device, a stress direction can be controlled by the $SiO_2$ film formed as the lower layer of the trench portion by utilizing the spin coating method, and an operating current of each of an n-channel FET and a p-channel FET can be improved by up to 20%. In addition, a leakage current caused to flow through a junction portion is improved because a compressive stress due to the STI structure is reduced by a stress relaxing function of the $SiO_2$ film which is formed as the lower layer of the trench portion by utilizing the spin coating method.

However, in order to suppress the leakage current caused to flow through the junction portion in the STI structure as described above, it is necessary to prevent the compressive stress from being increased by thinning the $SiO_2$ film which is formed as the upper layer of the STI structure by utilizing the plasma CVD method. On the other hand, this semiconductor device involves a problem that the liner film is formed near each of a source region and a drain region, thereby deteriorating short channel characteristics.

BRIEF SUMMARY OF THE INVENTION

A semiconductor device according to one embodiment of the present invention includes:
a semiconductor substrate;
an isolation region including a liner film formed so as to contact a lower surface and a lower side surface of an inner wall of a trench formed in the semiconductor substrate, a first insulating film formed so that at least a part of a side surface and a lower surface of the first insulating film contact the liner film within the trench, and a second insulating film formed so as to contact an upper side of the first insulating film and formed so as to contact an upper side surface of the inner wall of the trench, the second insulating film having a higher etching resistance than that of the first insulating film; and
a plurality of semiconductor elements disposed on the semiconductor substrate so as to be isolated from one another by the isolation region.

A method of fabricating an isolation region according to another embodiment of the present invention includes:
forming a trench in a semiconductor substrate;
forming a liner film on each of a lower surface and a side surface of an inner wall of the trench;
forming a first insulating film within the trench having the liner film formed therein;
etching back the first insulating film until a height of an upper surface of the first insulating film becomes lower than that of a surface of the semiconductor substrate;
removing a part of an upper side of the liner film after the first insulating film is etched back; and
forming a second insulating film on the first insulating film after the part of the upper side of the liner film is removed.

BRIEF DESCRIPTION OF THE DRAWING

FIGS. 2A to 2I are respectively cross sectional views showing processes for fabricating an isolation region of the semiconductor device according to the first embodiment of the present invention;

DETAILED DESCRIPTION OF THE INVENTION

Figure 1A:
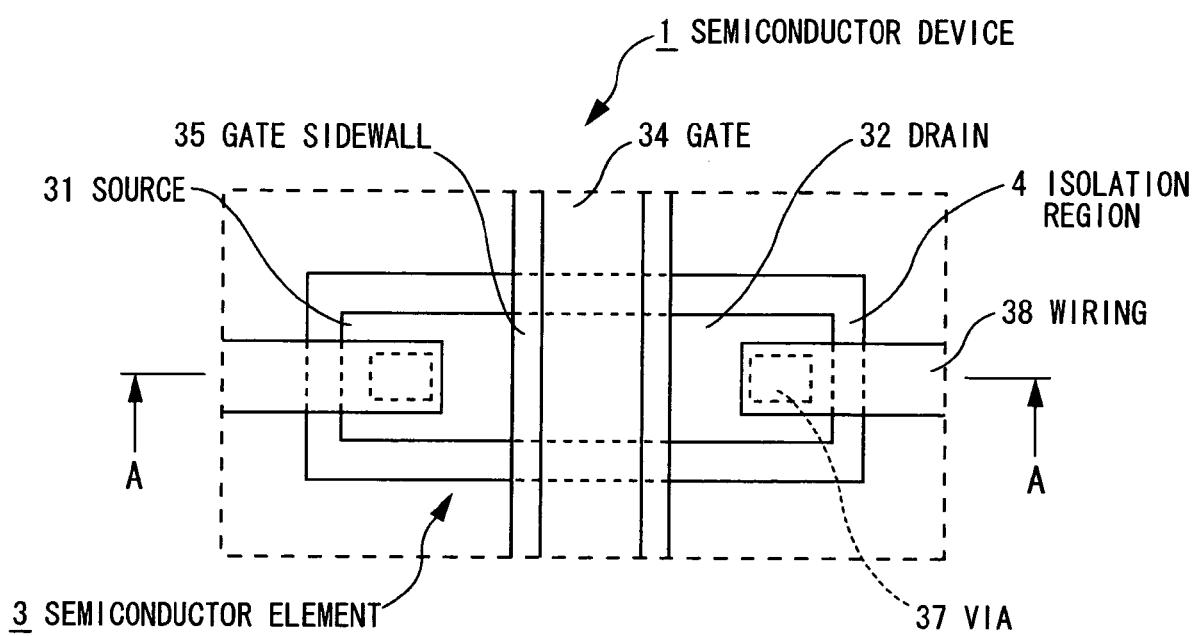
FIG. 1A is a partial top plan view of a semiconductor device according to a first embodiment of the present invention.
Figure 1B:
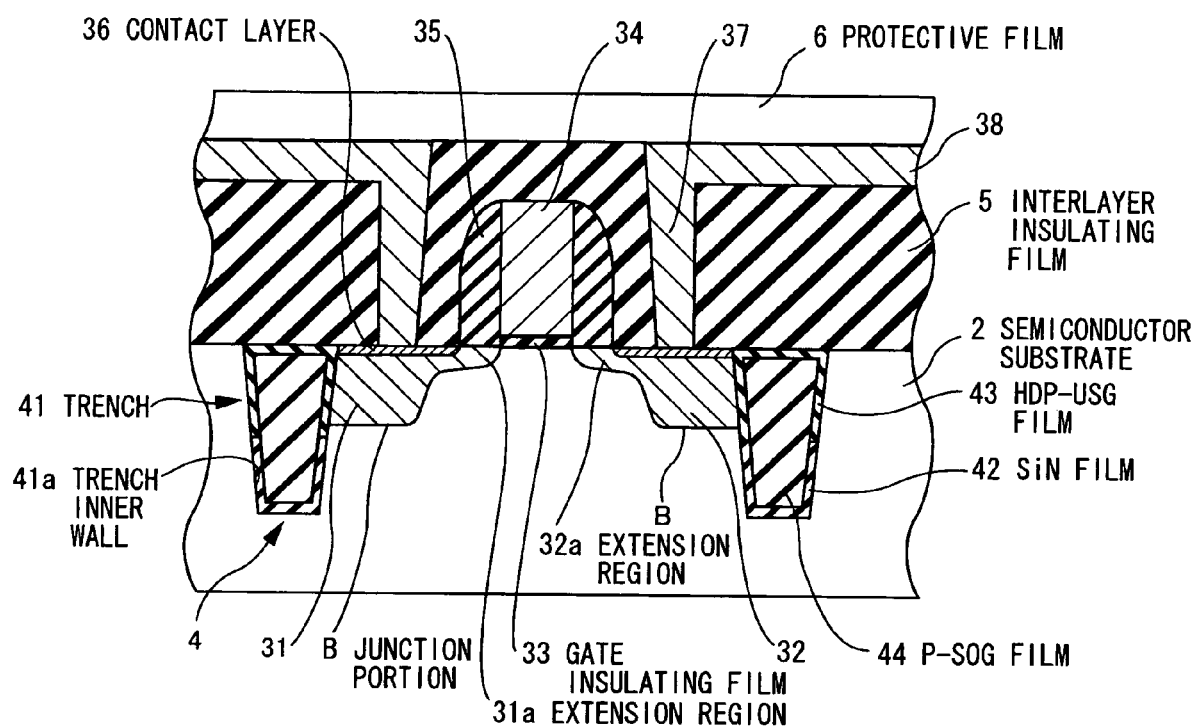
FIG. 1B is a cross sectional view taken on line A-A of FIG. 1A.

FIG. 1A is a partial top plan view of a semiconductor device according to a first embodiment of the present invention, and FIG. 1B is a cross sectional view taken on line A-A of FIG. 1A. Note that, an illustration of an interlayer insulating film 5, a protective film 6, and a contact layer 36 is omitted in FIG. 1A for the sake of convenience of a description.

A semiconductor device 1 according to this embodiment of the present invention includes a semiconductor substrate 2, a semiconductor element 3 formed on the semiconductor substrate 2, and an isolation region 4 through which the semiconductor element 3 is isolated from any of other semiconductor elements.

Although a silicon semiconductor substrate is used as the semiconductor substrate 2, a silicon on insulator (SOI) substrate or the like can also be used as the semiconductor substrate 2.

The semiconductor element 3 is a circuit element formed on the semiconductor substrate 2, and, for example, is a p-channel MOSFET or an n-channel MOSFET. Although an illustration of a well region is omitted in FIGS. 1A and 1B for the sake of convenience of a description, the semiconductor 3 may also be one which is formed on a p-type or n-type well region.

The semiconductor element 3 includes a source region 31 and a drain region 32 which have extension regions 31a and 32a, respectively, a gate insulating film 33, a gate 34, and a gate sidewall 35. The source region 31 and the drain region 32 are connected to a wiring 38 through the corresponding contact layers 36 and corresponding vias 37, respectively.

The isolation region 4 is a region through which an active region of the semiconductor element 3 is electrically isolated from any of other active regions of other semiconductor elements on the semiconductor substrate 2, and has a shallow trench isolation (STI) structure.

The isolation region 4 includes a SiN film 42 as a liner film which is formed so as to contact a lower surface and a lower side surface of a trench inner wall 41a as an inner wall of a trench 41 formed in the semiconductor substrate 2, a P-SOG film 44, as a first insulating film, in which at least a part of a side surface, and a lower surface of the P-SOG film 44 are formed so as to contact the SiN film 42 within the trench 41, and a high density plasma-undoped silicate glass (HDP-USG) film 43, as a second insulating film, which is formed so as to contact an upper side of the P-SOG film 44 and is formed so as to contact an upper side surface of the trench inner wall 41a, and which has a higher etching resistance against an etchant such as a hydrofluoric acid system etchant than that of the P-SOG film 44.

Here, the lower side surface of the trench inner wall 41a, for example, points to a region located in a position deeper than each of junction portions B, of the source region 31 and the drain region 32, in the side surfaces of the trench inner walls 41a and, for example, points to a region, of the side surface of the trench inner wall 41a, which is 0.1 μm or more in depth from the surface of the semiconductor substrate 2.

The HDP-USG film 43 has a function of generating a compressive stress applied to the junction portion B in order to apply the compressive stress to a peripheral region in the semiconductor substrate 2. On the other hand, the P-SOG film 44 has a function of generating a tensile stress in the junction portion B in order to apply the tensile stress to the peripheral region in the semiconductor substrate 2.

A portion of the HDP-USG film 43, corresponding to an upper surface of the P-SOG film 44, for example, has a thickness of 5 to 30 nm. When the thickness of the portion of the HDP-USG film 43 corresponding to the upper surface of the P-SOG film 44 is not larger than 5 nm, each of the etchings in processes for fabricating the semiconductor device 1 after the HDP-USG film 43 is formed may be more than the portion can resist. On the other hand, when the thickness of the portion exceeds 30 nm, the compressive stress applied to the peripheral region in the semiconductor substrate 2 increases to weaken the tensile stress which the P-SOG film 44 applies to the peripheral region in the semiconductor substrate 2.

The trench 41, for example, is formed to have a depth of 200 to 500 nm.

The SiN film 42, for example, is formed to have a depth of 10 to 20 nm. It is difficult to form the SiN film 42 in a thickness less than 10 nm while controllability for the thickness is maintained. On the other hand, when the thickness of the SiN film 42 exceeds 20 nm, it becomes difficult to fill the P-SOG film 44 in the trench 41 in the later process.

An insulating film such as a SiN film 42 is used as the liner film.

An insulating film having an etching resistance against the etchant such as the hydrofluoric acid system etchant higher than that of the P-SOG film 44 is preferably used as the second insulating film because the resistance against the process for element formation after formation of the isolation region 4 is required. Especially, HDP-USG as a silicate glass containing no impurity added thereto which is formed by utilizing a plasma chemical vapor deposition (CVD) method is preferably used as the second insulating film. In this embodiment, the HDP-USG film 43 is used as the second insulating film.

An insulating film which is more excellent in property of being filled in the trench than the SiN film 42, and which generates a tensile stress in the junction portion B is preferably used as the first insulating film. Especially, P-SOG is preferably used as the first insulating film. In this embodiment, the P-SOG film 44 is used as the first insulating film. The lower surface and the lower side surface of the P-SOG film 44 contact the SiN film 42, and the upper surface and the upper side surface thereof contact the HDP-USG film 43.

The semiconductor device 1 includes the semiconductor element 3 which is isolated from any of other semiconductor elements by the isolation region 4 formed in the semiconductor substrate 2, the wiring 38 or the like which is formed on the interlayer insulating film 5, the interlayer insulating film 5, the protective film 6, and the like.

FIGS. 2A to 2I are respectively cross sectional views explaining a method of fabricating the isolation region 4 of the semiconductor device 1 according to the first embodiment of the present invention. The method of fabricating the isolation region 4 of the semiconductor device 1 of the first embodiment will be described in detail hereinafter with reference to FIGS. 2A to 2I.

Figure 2A:
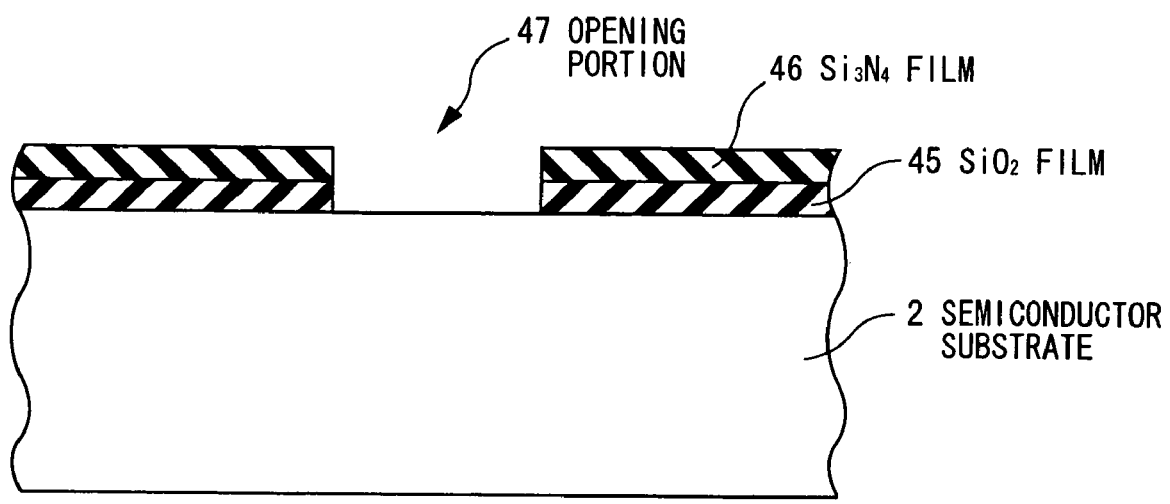

Firstly, a $SiO_2$ film 45, and a $Si_3N_4$ film 46 are formed in order on the semiconductor substrate 2 having a well region (not shown) formed therein. After the $Si_3N_4$ film 46 is coated with a photo mask material, a photo mask is formed through exposure and development processes, and the $Si_3N_4$ film 46 and the $SiO_2$ film 45 are selectively etched away by using the photo mask, thereby forming an opening portion 47. The opening portion 47 becomes a region in which the trench 41 is intended to be formed (FIG. 2A).

Figure 2B:
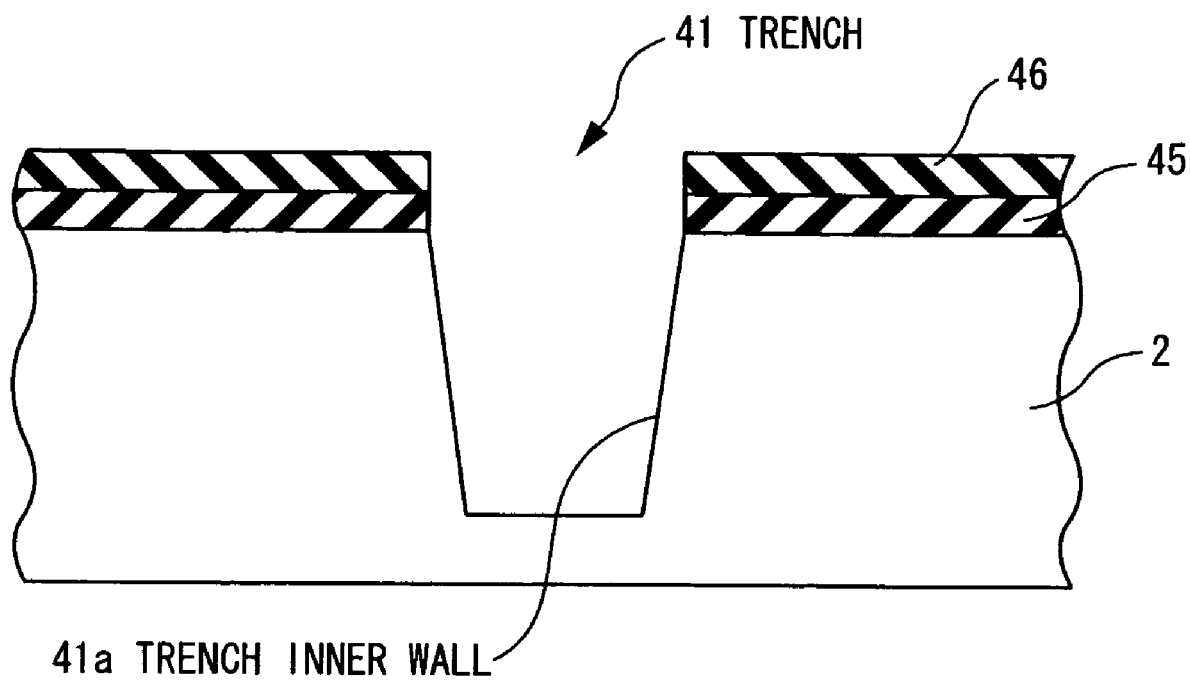

Next, the semiconductor substrate 2 is selectively etched away with each of the $SiO_2$ film 45 and the $Si_3N_4$ film 46 as a mask by utilizing a reactive ion etching (RIE) method, thereby forming the trench 41 (FIG. 2B).

Figure 2C:
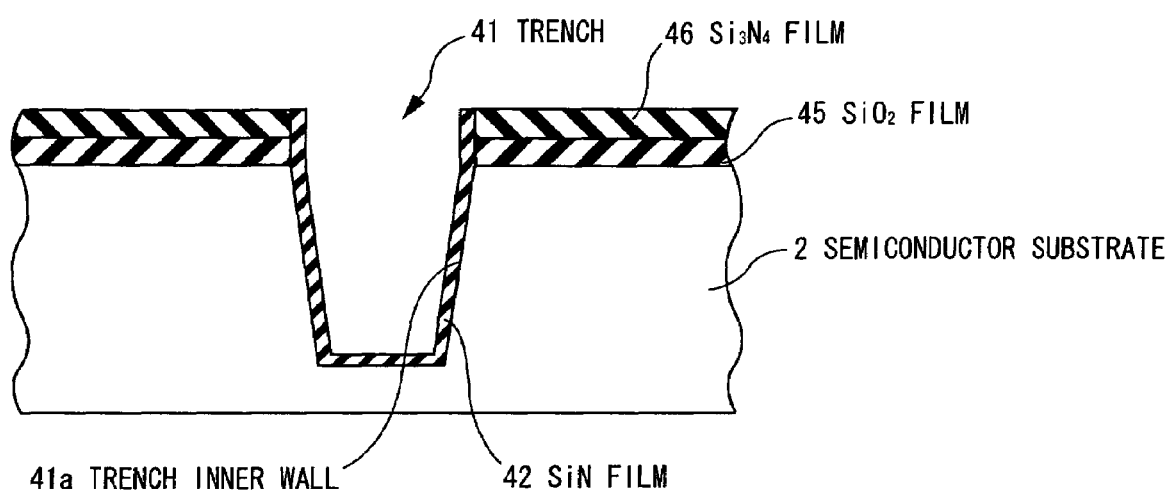

A silicon nitride film is deposited on the trench inner wall 41a, thereby forming the SiN film 42 as the liner film (FIG. 2C).

Figure 2D:
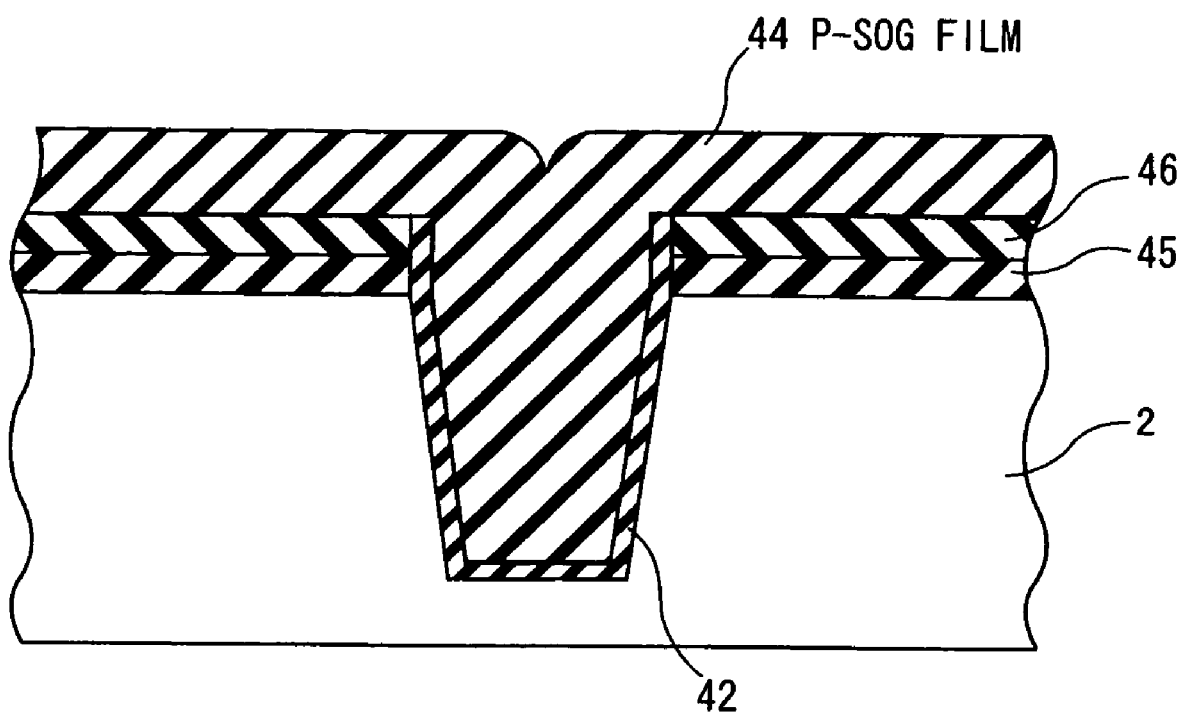

After the surface of the semiconductor substrate 2 is coated with P-SOG by utilizing the spin coating method, the P-SOG film 44 is formed by performing an annealing treatment for P-SOG (FIG. 2D).

Figure 2E:
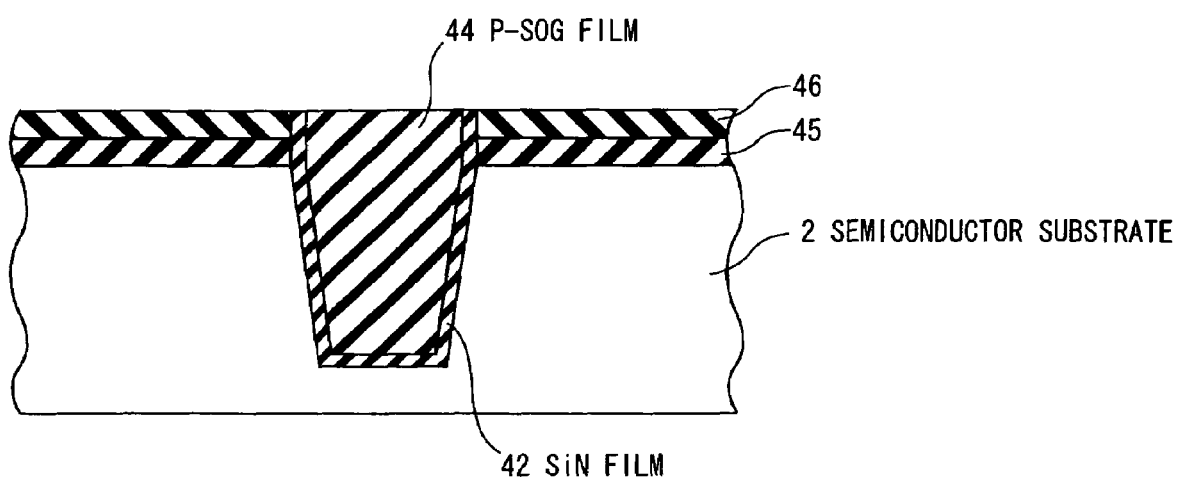

The P-SOG film 44 is flattened with the $Si_3N_4$ film 46 as a polishing stopper by utilizing a chemical mechanical polishing (CMP) method (FIG. 2E).

Figure 2F:
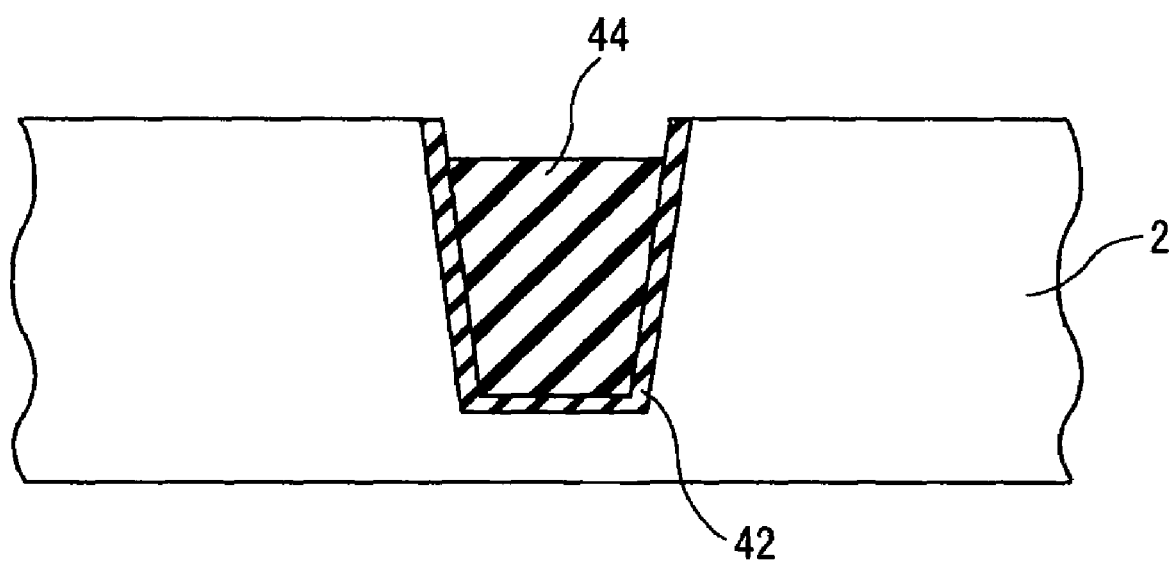

After the $Si_3N_4$ film 46 and the $SiO_2$ film 45 are removed in order by utilizing suitable etching methods, respectively, the P-SOG film 44 is etched back only to a predetermined depth from the surface of the semiconductor substrate 2. Since the HDP-USG film 43 which generates a compressive stress applied to the junction portion B is filled in the region obtained through the etch back process in the later process, the predetermined depth determines the thickness of the HDP-USG film 43. Preferably, the predetermined depth corresponds to a thickness of the HDP-USG film 43 enough to resist the various etchings in the later processes for fabricating the semiconductor device 1, and also is such a depth that the HDP-USG film 43 is formed to have a thin thickness as much as possible (FIG. 2F).

Figure 2G:
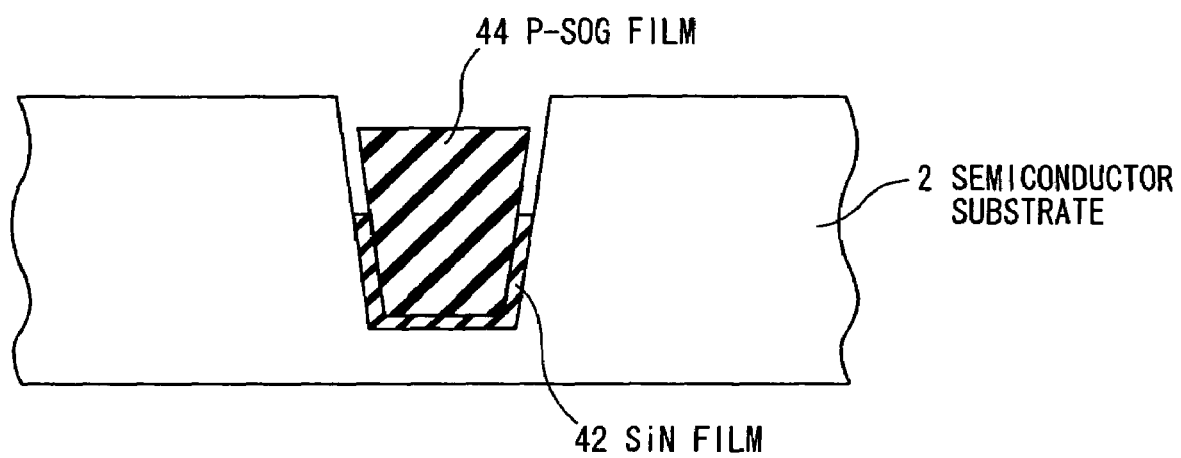

Next, only the SiN film 42 is etched to a predetermined depth by using a hot phosphoric acid (FIG. 2G).

Figure 2H:
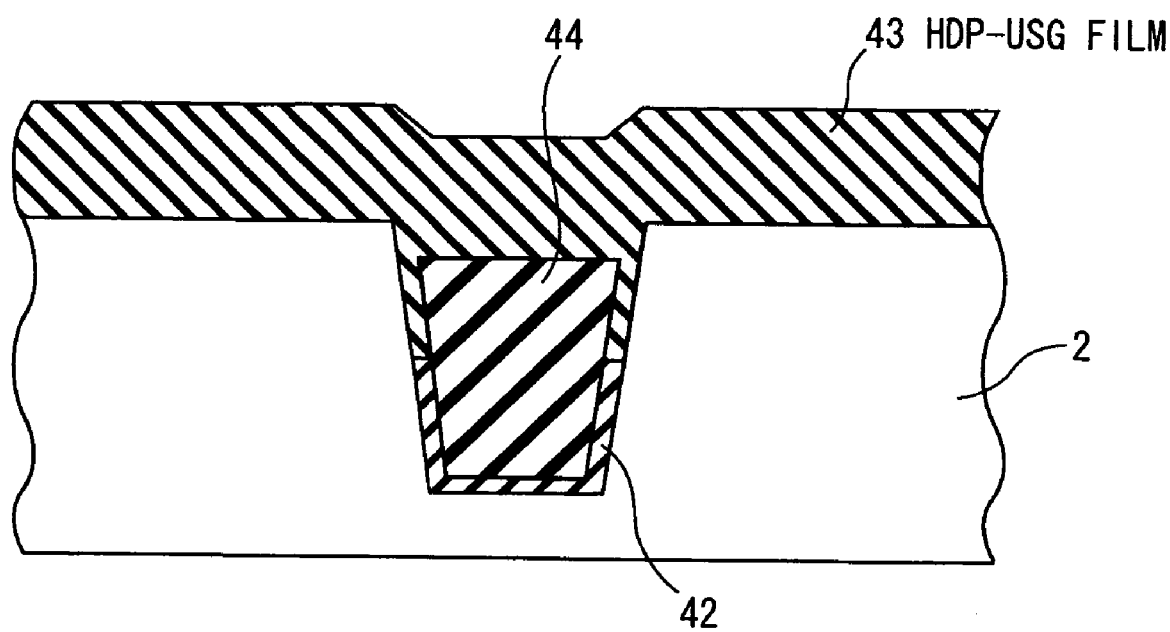
Figure 21:
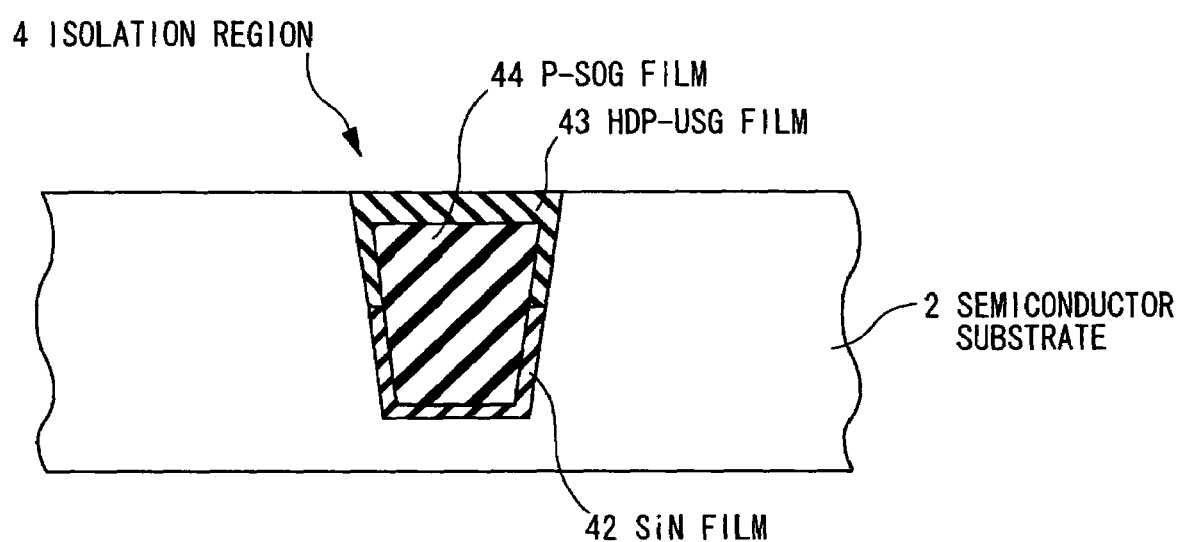

The HDP-USG film 43 is deposited over the entire surface of the semiconductor substrate 2 by utilizing a plasma CVD method (FIG. 2H).

Next, the HDP-USG film 43 is flattened by utilizing the CMP method, thereby forming the isolation region 4 having the STI structure of the semiconductor device 1 according to the first embodiment of the present invention (FIG. 2I).

After the isolation region 4 is formed, the semiconductor element 3 is formed through the normal processes for fabricating a semiconductor device, thereby completing the semiconductor device 1.

According to the first embodiment of the present invention, since the HDP-USG film 43 is the material having the high etching resistance against the etchant such as the hydrofluoric acid system etchant, an amount of etched HDP-USG film 43 is less even through the etching using the etchant such as the hydrofluoric acid system etchant in the later process. For this reason, the HDP-USG film 43 constituting the upper layer of the STI structure can be thinned. Therefore, the compressive stress applied to the junction portion B can be prevented from being increased as compared with that in the case where the HDP-USG film 43 is thickened. As a result, the stress applied to the junction portion B shown in FIG. 1B can be relaxed and the generation of crystal defects can be suppressed, which results in that a leakage current caused to flow through the junction portion B can be suppressed.

Note that, chemical oxide removal (COR) processing may be executed as the etching processing in the later process after the HDP-USG film 43 is formed. In this case as well, an amount of etched HDP-USG film 43 can be suppressed. As a result, the same effects as those in the case where the etching using the hydrofluoric acid system etchant is performed are obtained.

On the other hand, the SiN film 42 is formed on the lower side of the trench inner wall 41a below an intermediate portion of the trench 41 in a depth direction, and the P-SOG film 44 is filled in a central portion of the trench 41. Since the P-SOG film 44 is a material which generates a tensile stress, an increase in compressive stress applied to the junction portion B can be suppressed as compared with that in the case where the SiN film 42 is filled in the central portion of the trench 41.

In addition, it becomes clear that when the SiN film 42 is formed near the source region 31 or the drain region 32, the short channel characteristics are deteriorated. However, in the first embodiment of the present invention, the SiN film 42 can be formed in a deep position right under the HDP-USG film 43 along the trench inner wall 41a. Consequently, since the SiN film 42 and the source region 31 or the drain region 32 can be formed apart from each other to some degree, the deterioration of the short channel characteristics can be suppressed.

In addition, since the P-SOG film 44 which generates the tensile stress is filled in the trench 41, such a stress as to improve a carrier mobility can be applied to the active region. In the conventional MOSFET, the $SiO_2$ film is filled in the trench by utilizing the CVD method. Hence, the compressive stress is applied to the active region in all directions, and thus the conventional MOSFET has necessarily a tendency to deteriorate the carrier mobility or the like.

Figure 3A:
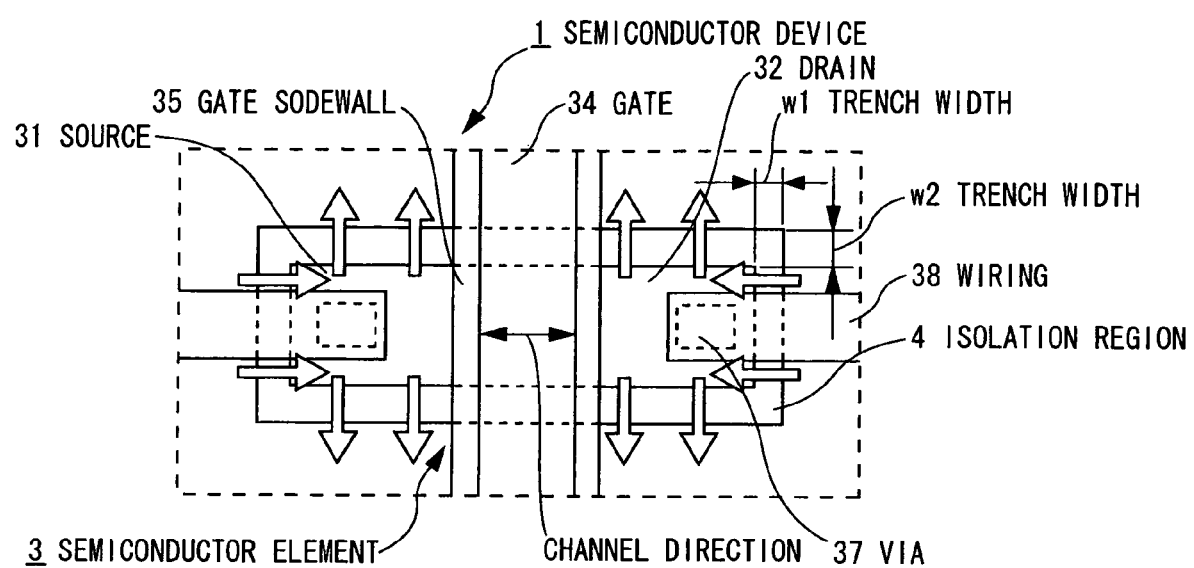
FIG. 3A is a top plan view of the semiconductor device having a p-channel MOSFET in which desirable directions of application of stresses to a semiconductor element are indicated by arrows, respectively.
Figure 3B:
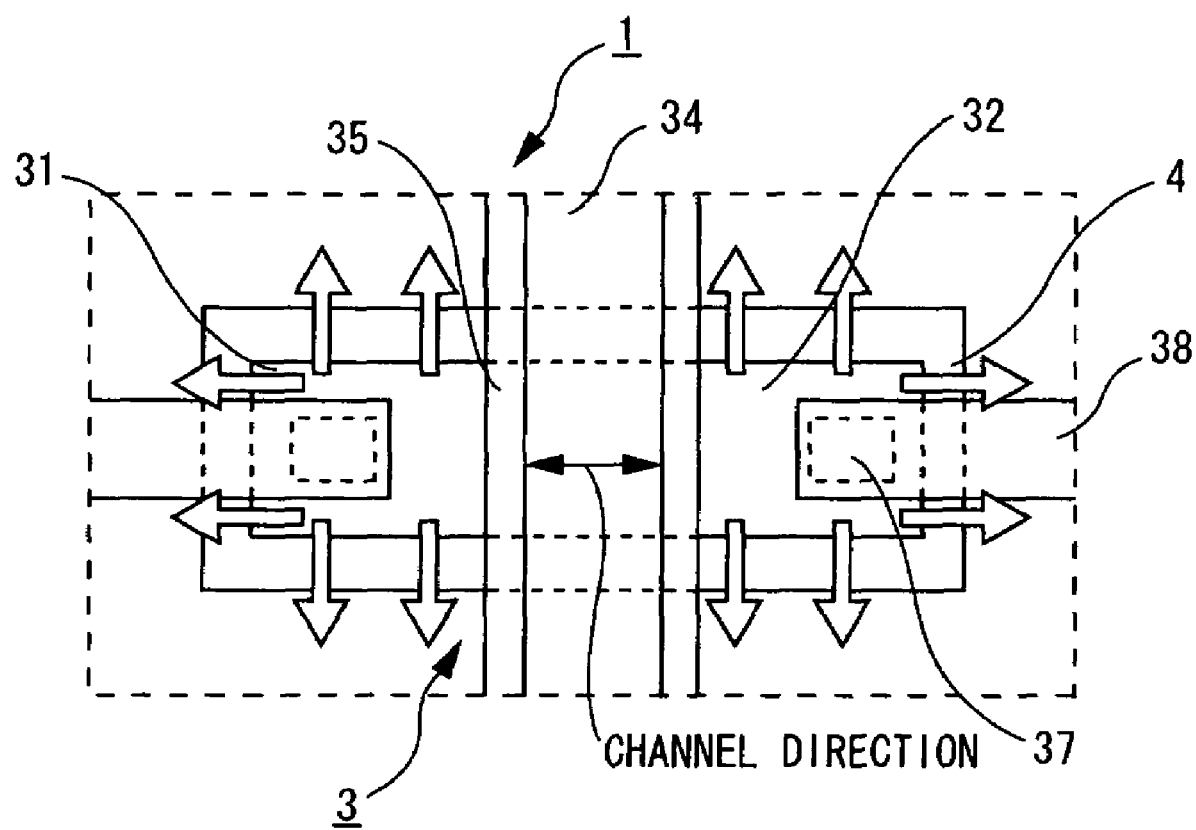
FIG. 3B is a top plan view of the semiconductor device having an n-channel MOSFET in which desirable directions of application of stresses to a semiconductor element are indicated by arrows, respectively.

FIG. 3A is a top plan view of the semiconductor device 1 having a p-channel MOSFET in which desirable directions of application of stresses to the semiconductor element 3 are indicated by arrows, respectively, and FIG. 3B is a top plan view of the semiconductor device 1 having an n-channel MOSFET in which desirable directions of application of stresses to the semiconductor element 3 are indicated by arrows, respectively.

In the case of the p-channel MOSFET, a compressive stress is applied in a channel direction and a tensile stress is applied in a direction vertical to the channel direction, thereby improving the carrier mobility. Since the isolation region 4 of the semiconductor device 1 of this embodiment has the P-SOG film 44, the P-SOG film 44 generates the tensile stress in each of the channel direction and the direction vertical to the channel direction. For this reason, with respect to a trench width of the trench 41 of in the isolation region 4 surrounding the semiconductor element 3, for example, a trench width w1 in the channel direction is narrowed, and a trench width w2 in the direction vertical to the channel direction is widened, which results in that the tensile stress in the channel direction is reduced, and the tensile stress in the direction vertical to the channel direction is increased, thereby making it possible to enhance the performance of the p-channel MOSFET.

On the other hand, in the case of the n-channel MOSFET, the tensile stress is applied in each of the channel direction and the direction vertical to the channel direction, thereby improving the carrier mobility. For this reason, the direction of the stress generated by the isolation region 4 of the semiconductor device 1 of this embodiment agrees with that of the stress with which the performance of the n-channel MOSFET is improved, thereby making it possible to improve the performance of the n-channel MOSFET.

An isolation region 4 of a semiconductor device 1 according to a second embodiment of the present invention includes the SiN film 42 which is formed so as to contact the lower surface and the lower side surface of the trench inner wall 41a as the inner wall of the trench 41 formed in the semiconductor substrate 2, a P-SOG film 44 which is formed so that at least a part of a side surface and a lower surface of the P-SOG film 44 contact the SiN film 42 within the trench 41, and an HDP-USG film 43 which is formed so as to contact an upper side of the P-SOG film 44, and is formed so as to contact the upper side surface of the trench inner wall 41a, and which has a higher etching resistance against the etchant such as the hydrofluoric acid sysyem etchant than that of the P-SOG film 44. The isolation region 4 of the semiconductor device 1 of the second embodiment is different from that of the semiconductor device 1 of the first embodiment in that the HDD-USG film 43 is thickly formed. Since the isolation region 4 of the second embodiment is identical in other respects to that of the first embodiment, a description thereof is omitted here for the sake of simplicity. A method of fabricating the isolation region 4 of the semiconductor device 1 according to the second embodiment of the present invention will be described in detail hereinafter with reference to FIGS. 4A to 4C, thereby clarifying the structure of the isolation region 4 of the semiconductor device 1 of the second embodiment.

Figure 4A:
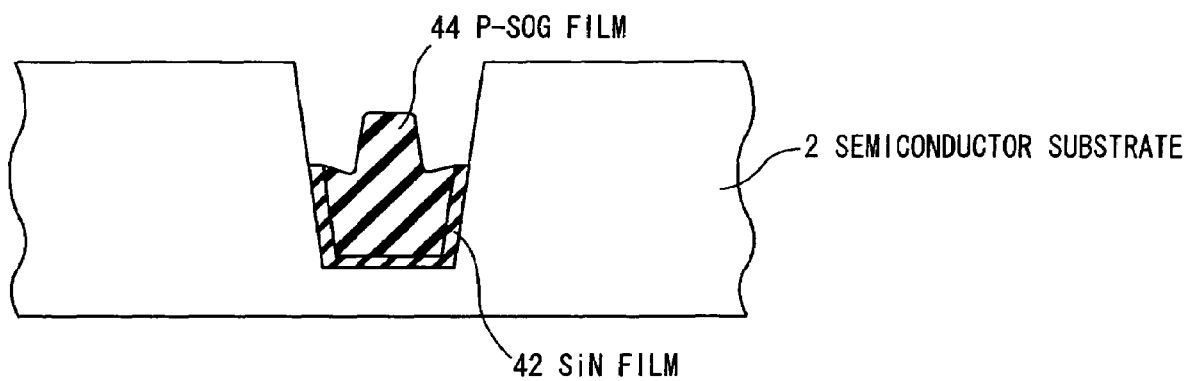
FIGS. 4A to 4C are respectively cross sectional views showing processes for fabricating an isolation region of a semiconductor device according to a second embodiment of the present invention.
Figure 4B:
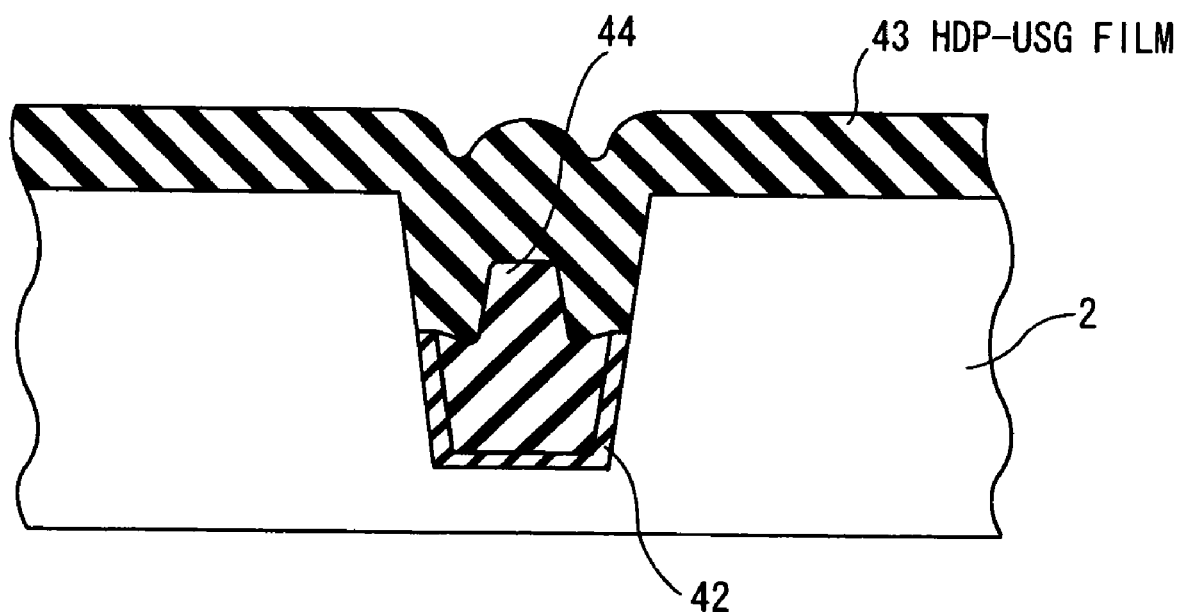
Figure 4C:
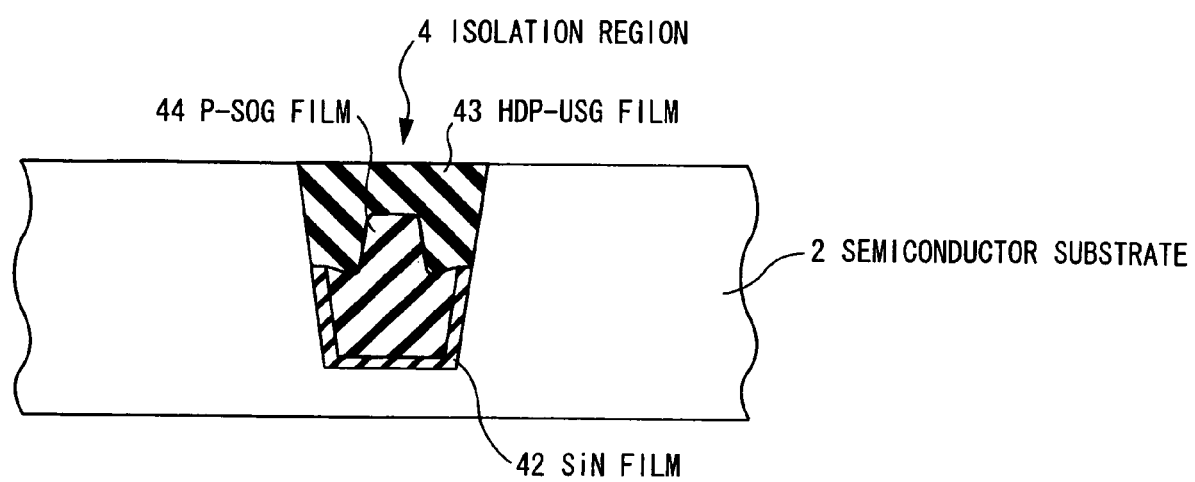

FIGS. 4A to 4C are respectively cross sectional views showing the method of fabricating the isolation region 4 of the semiconductor device 1 according to the second embodiment of the present invention.

Firstly, up to the process for etching the SiN film 42 shown in FIGS. 2A to 2G in the first embodiment is performed.

After completion of the process shown in FIG. 2G, the P-SOG film 44 is etched back approximately to the same depth as that of the SiN film 42 in the vicinity of the trench inner wall 41a by utilizing an isotropic etching method (FIG. 4A). In this case, the P-SOG film 44 is processed into a protrusion shape in which a part near a center of an upper surface of the P-SOG film 44 protrudes by performing the isotropic etching.

An HDP-USG film 43 is deposited over the entire surface of the semiconductor substrate 2 by utilizing a plasma CVD method (FIG. 4B).

Next, the HDP-USG film 43 is flattened by utilizing the CMP method, thereby forming the isolation region 4 of the semiconductor device 1 according to the second embodiment of the present invention (FIG. 4C).

According to the second embodiment of the present invention, in addition to the effects of the first embodiment, the following effect is obtained. That is to say, since the P-SOG film 44 is etched back in the process shown in FIG. 4A by utilizing the isotropic etching method, the filling-in property is improved when the HDP-USG film 43 is filled in the trench 41 in the subsequent process. Thus, the generation or the like of the voids or the seams is suppressed. As a result, the effect is offered which is advantageous in an improvement in the performance and in enhancement of the yield.

An isolation region 4 of a semiconductor device 1 according to a third embodiment of the present invention includes the SiN film 42 which is formed so as to contact the lower surface and the lower side surface of the trench inner wall 41a as the inner wall of the trench 41 formed in the semiconductor substrate 2, a P-SOG film 44 which is formed so that at least a part of a side surface and a lower surface of the P-SOG film 44 contact the SiN film 42 within the trench 41, and an HDP-USG film 43 which is formed so as to contact an upper side of the P-SOG film 44, and is formed so as to contact an upper side surface of the trench inner wall 41a, and which has a higher etching resistance against the etchant such as the hydrofluoric acid system etchant than that of the P-SOG film 44. The isolation region 4 of the semiconductor device 1 of the third embodiment is different from that of the semiconductor device 1 of each of the first and second embodiments in that the P-SOG film 44 is formed in a region which is surrounded not only by the SiN film 42 and the HDP-USG film 43, but also by a part of the upper side portion of the trench inner wall 41a. Since the isolation region 4 of the third embodiment is identical in other respects to that of each of the first and second embodiments, a description thereof is omitted here for the sake of simplicity. A method of fabricating the isolation region 4 of the semiconductor device 1 according to the third embodiment of the present invention will be described in detail hereinafter with reference to FIGS. 5A to 5F, thereby clarifying the structure of the isolation region 4 of the semiconductor device 1 of the third embodiment.

FIGS. 5A to 5F are respectively cross sectional views showing the method of fabricating the isolation region 4 of the semiconductor device 1 according to the third embodiment of the present invention.

Firstly, up to the process for flattening the P-SOG film 44 shown in FIGS. 2A to 2E in the first embodiment is performed.

Figure 5A:
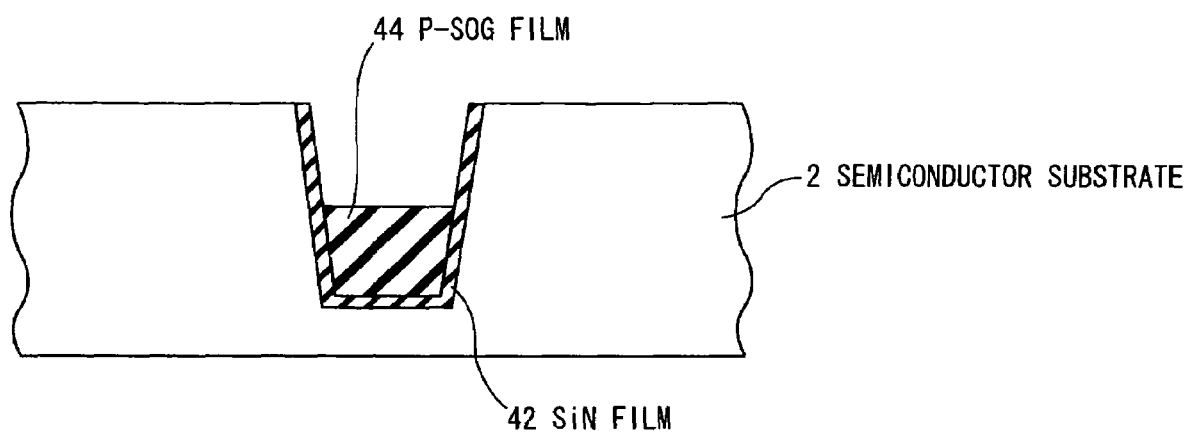
FIG. 5A to 5F are respectively cross sectional views showing processes for fabricating an isolation region of a semiconductor device according to a third embodiment of the present invention.

After compression of the process shown in FIG. 2E, the $Si_3N_4$ film 46 and the $SiO_2$ 45 are etched away in order by utilizing the suitable etching methods, respectively, and the P-SOG film 44 is etched back to a predetermined depth from the surface of the semiconductor substrate 2. In this case, the predetermined depth is set larger than that in the first embodiment shown in FIG. 2F (FIG. 5A).

Figure 5B:
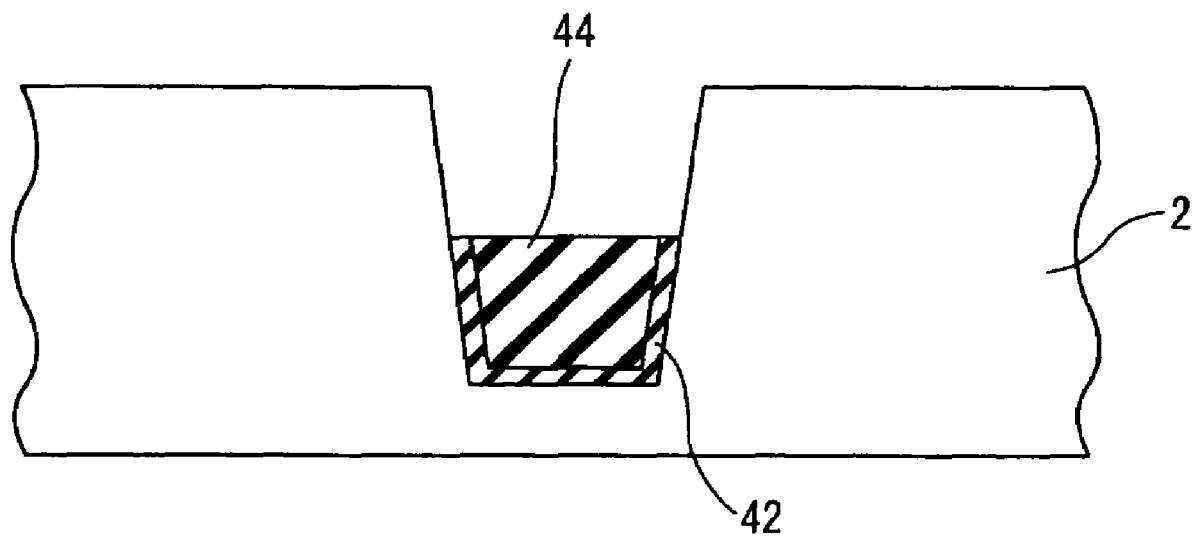

Next, only the SiN film 42 is etched approximately to the same depth as that of an upper surface of the P-SOG film 44 by using the hot phosphoric acid (FIG. 5B).

Figure 5C:
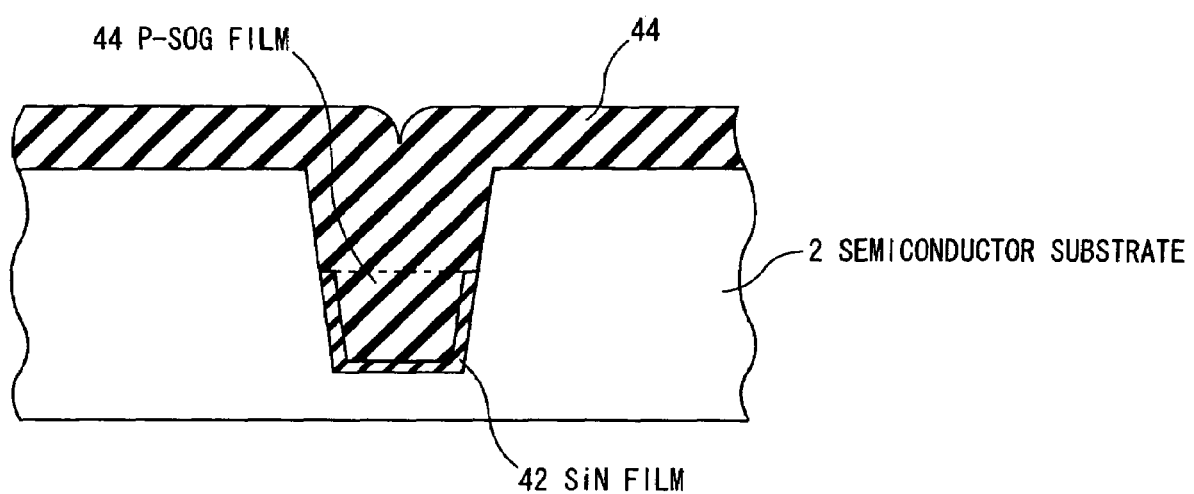

After completion of the spin coating of P-SOG, an upper P-SOG film 44 is formed integrally with the lower P-SOG film 44, which is previously formed, by performing an annealing treatment for the upper P-SOG film 44 (FIG. 5C).

Figure 5D:
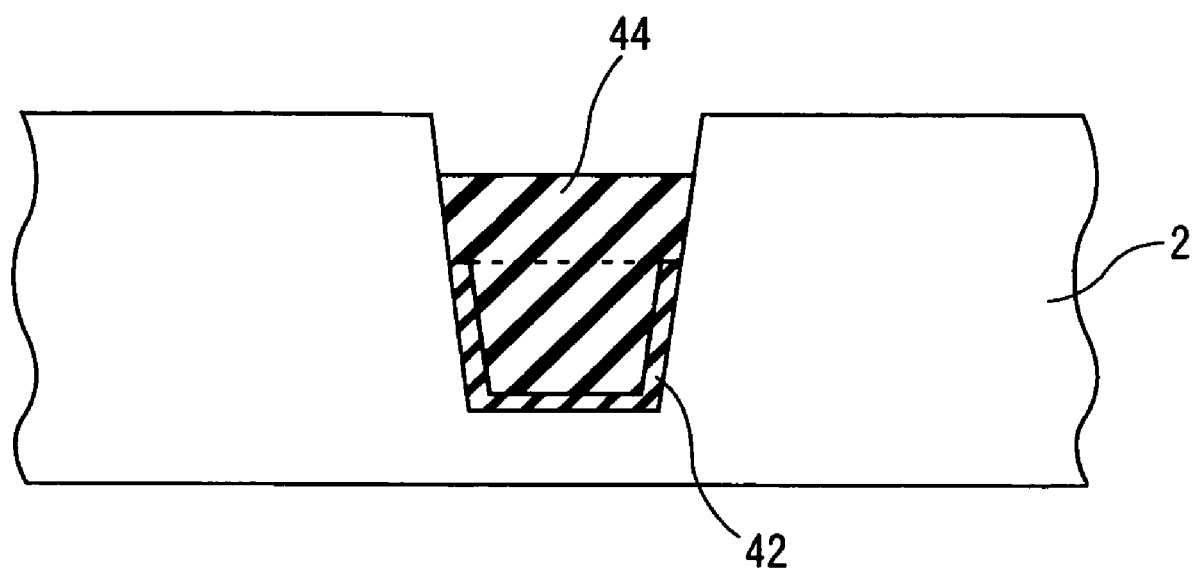

After being flattened by utilizing the CMP method, the P-SOG film 44 is etched back to a predetermined depth from the surface of the semiconductor substrate 2. The predetermined depth determines a thickness of the HDP-USG film 43 because the HDP-USG film 43 which generates a compressive stress applied to the junction portion B is filled in a region obtained through the etch back process in the later process. Preferably, the predetermined depth corresponds to a thickness of the HDP-USG film 43 enough to resist the various etchings in the later processes for fabricating the semiconductor device 1, and also is such a depth that the HDP-USG film 43 is formed to have a thin thickness as much as possible (FIG. 5D). Note that, the process for flattening the P-SOG film 44 by utilizing the CMP method before the above-mentioned etch back process may be omitted here.

Figure 5E:
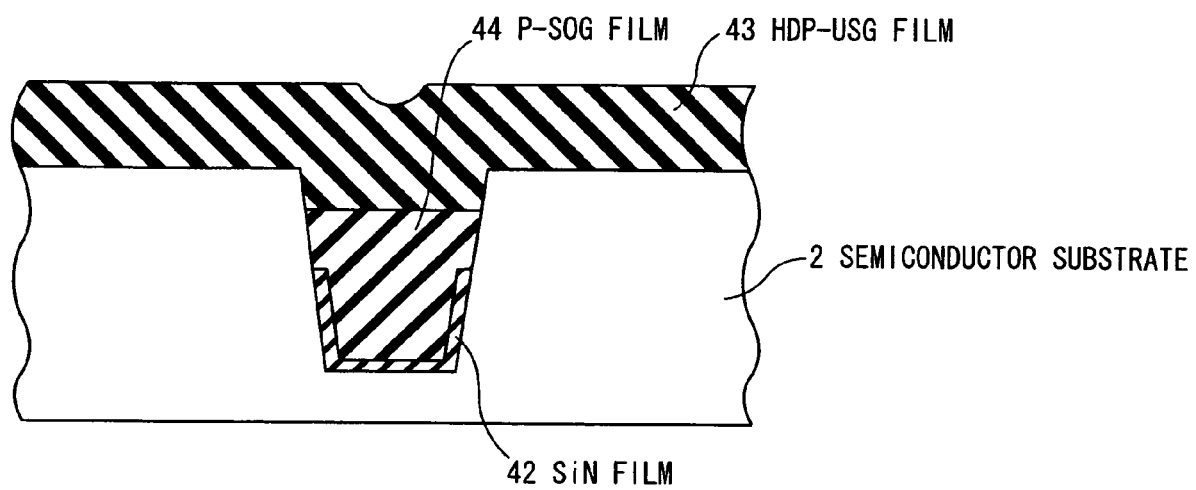

An HDP-USG film 43 is deposited over the entire surface of the semiconductor substrate 2 by utilizing the plasma CVD method (FIG. 5E).

Figure 5F:
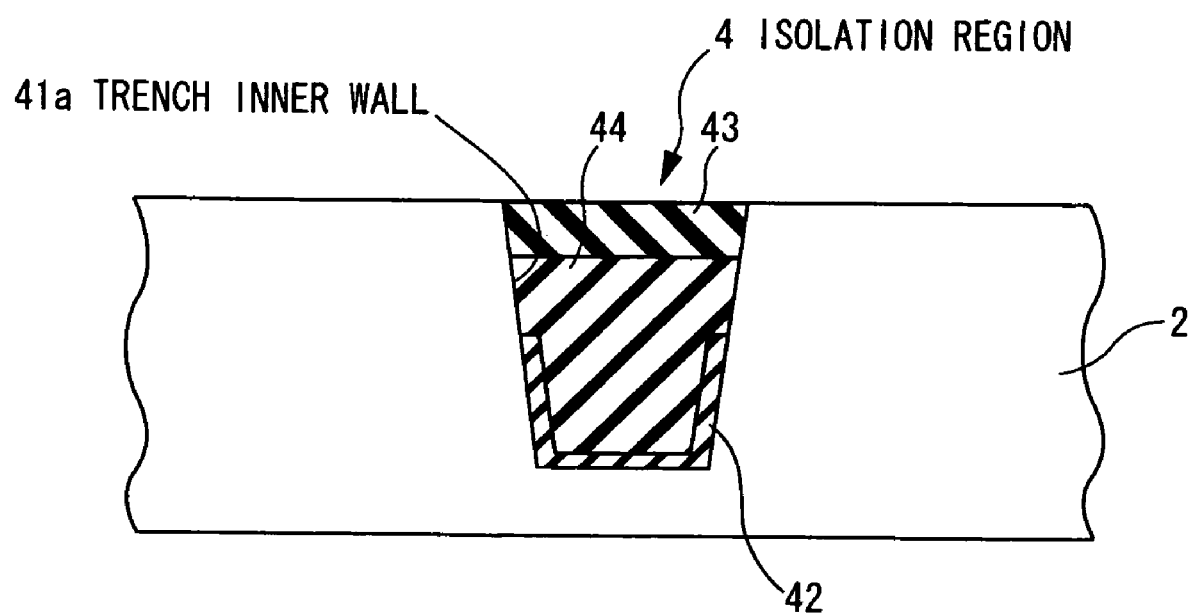

Next, the HDP-USG film 43 is flattened by utilizing the CMP method, thereby forming the isolation region 4 of the semiconductor device 1 according to the third embodiment of the present invention (FIG. 5F).

According to the third embodiment of the present invention, in addition to the effects of the first embodiment, the following effect is obtained. That is to say, since the HDP-USG film 43 is filled in the region having the wide trench width in the process shown in FIG. 5E, the filling-in property is further improved as compared with that in the second embodiment. Thus, the generation or the like of the voids or the seams is suppressed. As a result, the effect is offered which is advantageous in an improvement in the performance and in enhancement of the yield.

It should be noted that the present invention is not intended to be limited to the above-mentioned embodiments, and the various changes can be implemented by those skilled in the art without departing from the gist of the invention.

In addition, the constituent elements of the above-mentioned embodiments can be arbitrarily combined with one another without departing from the gist of the invention.

What is claimed is:

1. A semiconductor device, comprising:
   a semiconductor substrate;
   an isolation region including a liner film formed so as to contact a lower surface and a lower side surface of an inner wall of a trench formed in the semiconductor substrate, a first insulating film formed so that at least a part of a side surface and a lower surface of the first insulating film contact the liner film within the trench, and a second insulating film formed so as to contact an upper side of the first insulating film and formed so as to contact an upper side surface of the inner wall of the trench, the second insulating film having a higher etching resistance than that of the first insulating film; and a plurality of semiconductor elements disposed on the semiconductor substrate so as to be isolated from one another by the isolation region, wherein the first insulating film has the lower surface and a lower side surface which contact the liner film, and has an upper surface and an upper side surface which contact the second insulating film.

2. The semiconductor device according to claim 1, wherein the lower side surface of the inner wall of the trench is a region, of a side surface of the inner wall of the trench, which is located in a deeper position than that of a junction depth of each of source/drain regions which the plurality of semiconductor elements have, respectively.

3. The semiconductor device according to claim 1, wherein the second insulating film has the higher etching resistance against a hydrofluoric acid system etchant than that of the first insulating film.

4. The semiconductor device according to claim 1, wherein the first insulating film applies a tensile stress to a peripheral region of the first insulating film of the semiconductor substrate.

5. The semiconductor device according to claim 1, wherein the first insulating film is a P-SOG film.

6. The semiconductor device according to claim 1, wherein the second insulating film is an HDP-USG film.

7. The semiconductor device according to claim 1, wherein a portion, of the second insulating film, which is located on an upper surface of the first insulating film has a thickness of 5 to 30 nm.

8. The semiconductor device according to claim 1, wherein the liner film is a SiN film.

9. The semiconductor device according to claim 1, wherein the liner film has a thickness of 10 to 20 nm.

10. A semiconductor device, comprising:
a semiconductor substrate;
an isolation region including a liner film formed so as to contact a lower surface and a lower side surface of an inner wall of a trench formed in the semiconductor substrate, a first insulating film formed so that at least a part of a side surface and a lower surface of the first insulating film contact the liner film within the trench, and a second insulating film formed so as to contact an upper side of the first insulating film and formed so as to contact a part of an upper side surface of the inner wall of the trench, the second insulating film having a higher etching resistance than that of the first insulating film; and a plurality of semiconductor elements disposed on the semiconductor substrate so as to be isolated from one another by the isolation region, wherein the first insulating film has the lower surface and a lower side surface which contact the liner film, has an upper side surface which contacts another part of the upper side surface of the inner wall of the trench, and has an upper surface which contacts the second insulating film.

11. The semiconductor device according to claim 10, wherein the lower side surface of the inner wall of the trench is a region, of a side surface of the inner wall of the trench, which is located in a deeper position than that of a junction depth of each of the source/drain regions which the plurality of semiconductor elements have, respectively.

12. The semiconductor device according to claim 10, wherein the second insulating film has the higher etching resistance against a hydrofluoric acid system etchant than that of the first insulating film.

13. The semiconductor device according to claim 10, wherein the first insulating film applies a tensile stress to a peripheral region of the first insulating film of the semiconductor substrate.

14. The semiconductor device according to claim 10, wherein the first insulating film is a P-SOG film.

15. The semiconductor device according to claim 10, wherein the second insulating film is an HDP-USG film.

16. The semiconductor device according to claim 10, wherein a portion, of the second insulating film, which is located on an upper surface of the first insulating film has a thickness of 5 to 30 nm.

17. The semiconductor device according to claim 10, wherein the liner film is a SiN film.

18. The semiconductor device according to claim 10, wherein the liner film has a thickness of 10 to 20 nm.

* * * * *